United States Patent
Huang et al.

(10) Patent No.: US 12,315,746 B2
(45) Date of Patent: May 27, 2025

(54) BOTTOM COVER PLATE TO REDUCE WAFER PLANAR NONUNIFORMITY

(71) Applicant: Applied Materials, Inc., Santa Clara, CA (US)

(72) Inventors: Zubin Huang, Santa Clara, CA (US);
Srinivas Tokur Mohana, Bangalore (IN); Sandesh Yadamane, Bangalore (IN); Kai Wu, Palo Alto, CA (US);
Jallepally Ravi, San Ramon, CA (US);
Xiaozhou Yu, Santa Clara, CA (US);
Peiqi Wang, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 62 days.

(21) Appl. No.: 17/508,581

(22) Filed: Oct. 22, 2021

(65) Prior Publication Data
US 2023/0130756 A1     Apr. 27, 2023

(51) Int. Cl.
| | |
|---|---|
| *H01L 21/67* | (2006.01) |
| *C23C 16/458* | (2006.01) |
| *C23C 16/46* | (2006.01) |
| *H01L 21/687* | (2006.01) |

(52) U.S. Cl.
CPC .... *H01L 21/67109* (2013.01); *C23C 16/4586* (2013.01); *C23C 16/46* (2013.01); *H01L 21/68792* (2013.01)

(58) Field of Classification Search
None
See application file for complete search history.

(56) References Cited

U.S. PATENT DOCUMENTS

| | | | |
|---|---|---|---|
| 6,241,825 B1* | 6/2001 | Wytman | C23C 16/4583 269/21 |
| 6,485,603 B1* | 11/2002 | Yee | H01L 21/67115 156/345.48 |
| 10,861,676 B2 | 12/2020 | Cui et al. | |

(Continued)

FOREIGN PATENT DOCUMENTS

| | | |
|---|---|---|
| JP | 2004307939 A | 11/2004 |
| JP | 2015106595 A | 6/2017 |
| KR | 101205433 B1 | 11/2012 |

OTHER PUBLICATIONS

International Search Report / Written Opinion Issued To PCT/US2022/038996 on Dec. 2, 2022.

(Continued)

*Primary Examiner* — Jeffrie R Lund
*Assistant Examiner* — Tiffany Z Nuckols
(74) *Attorney, Agent, or Firm* — Patterson + Sheridan, LLP

(57) ABSTRACT

Embodiments of the disclosure provided herein generally relate to a bottom cover plate (BCP) that enables control of radiation loss from a heating element inside a chamber for processing a substrate. The heating element is used to heat the substrate before or during processing and may heat the substrate unevenly due to uneven heat losses within the chamber. For example, the uneven heating of the substrate may result in uneven deposition of a material on the substrate, which may result in excess processing to correct the deposition or wasted product from disposing of improperly processed substrates. The BCP may be used to correct the uneven heating of the substrate.

20 Claims, 11 Drawing Sheets

(56) References Cited

U.S. PATENT DOCUMENTS

| | | | |
|---|---|---|---|
| 2003/0029564 A1* | 2/2003 | Brown | H01L 21/67069 |
| | | | 118/728 |
| 2003/0200931 A1* | 10/2003 | Goodwin | H01L 21/67115 |
| | | | 118/725 |
| 2013/0126515 A1* | 5/2013 | Shero | H01L 21/67115 |
| | | | 219/448.11 |
| 2013/0164948 A1 | 6/2013 | Romero et al. | |
| 2013/0284092 A1 | 10/2013 | Wilson et al. | |
| 2016/0258061 A1* | 9/2016 | Tsai | C23C 16/46 |
| 2017/0178758 A1 | 6/2017 | Ha et al. | |
| 2017/0191157 A1* | 7/2017 | Krishnan | H01L 21/68771 |
| 2018/0237916 A1* | 8/2018 | Tzu | C23C 16/4586 |
| 2019/0043698 A1* | 2/2019 | Parkhe | C23C 16/4585 |
| 2021/0183657 A1 | 6/2021 | Groechel et al. | |

OTHER PUBLICATIONS

Korean Office Action dated Jan. 15, 2025 for Application No. 10-2024-7015591 in 17 pages.

* cited by examiner

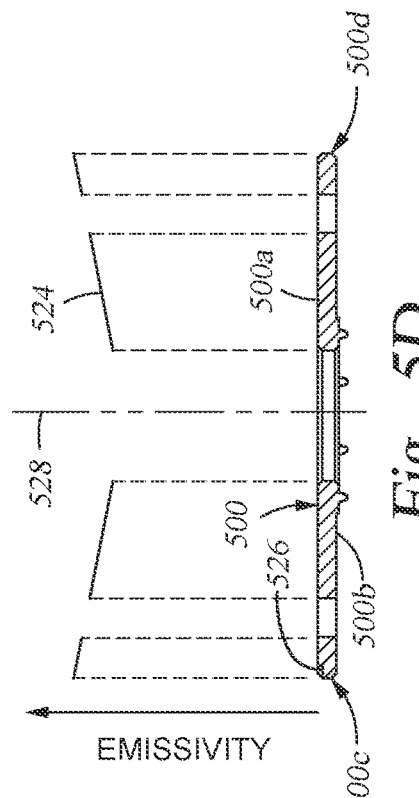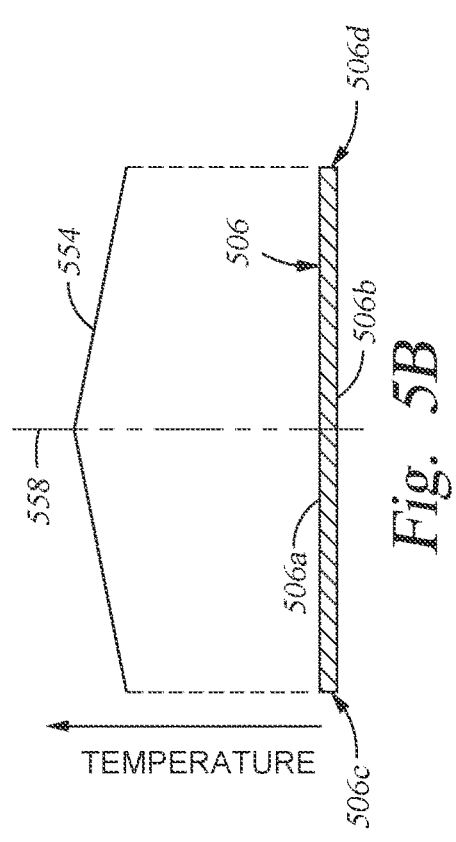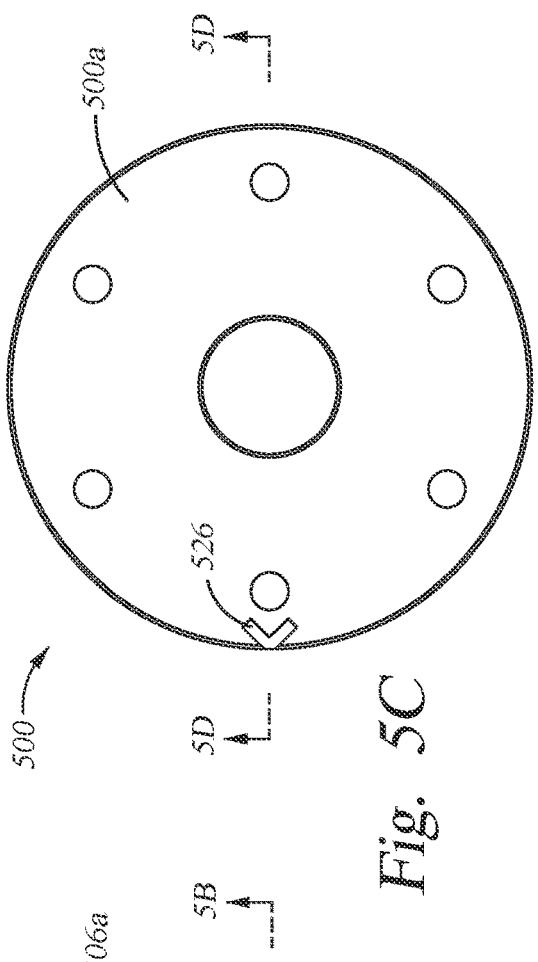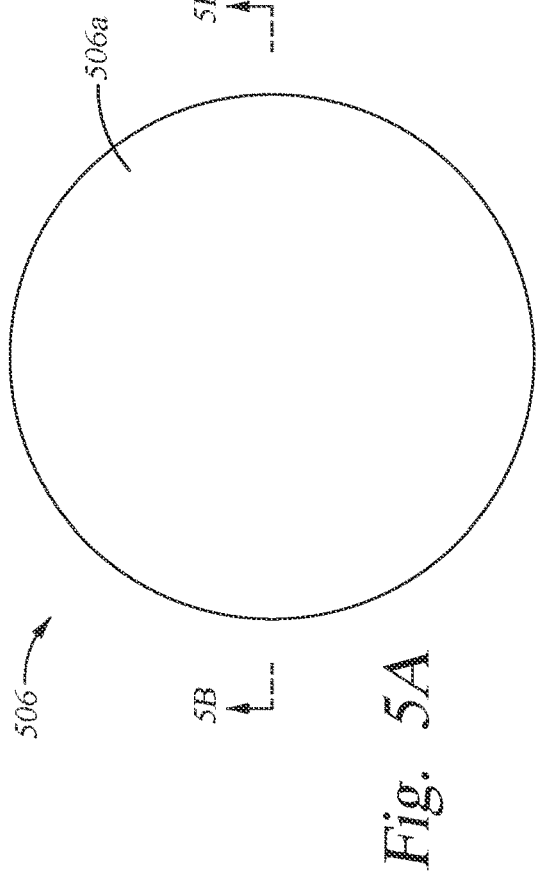
Fig. 5A
Fig. 5B
Fig. 5C
Fig. 5D

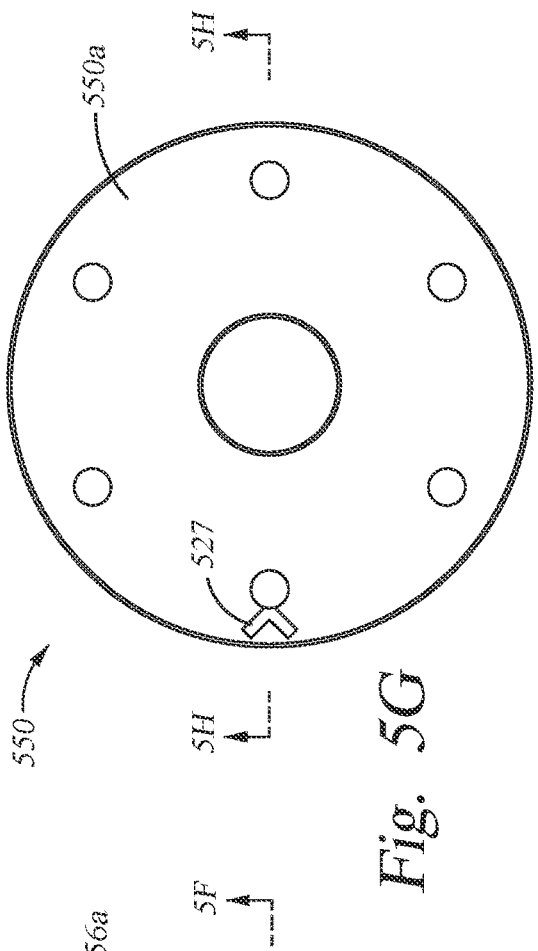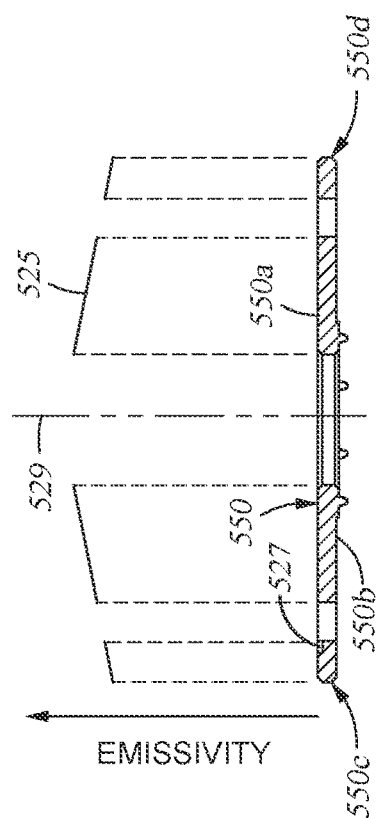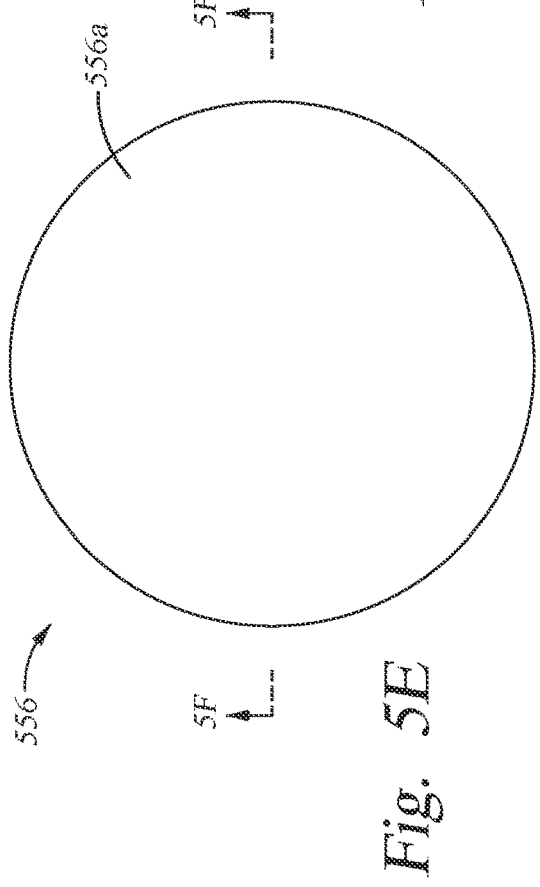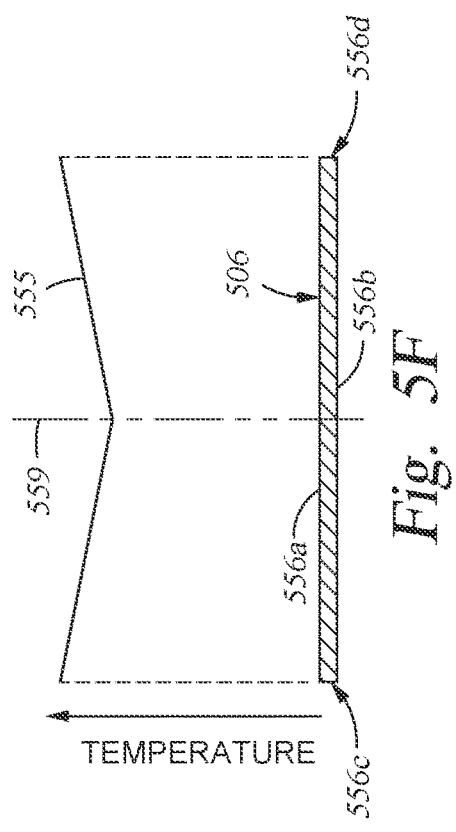
Fig. 5E
Fig. 5F
Fig. 5G
Fig. 5H

BOTTOM COVER PLATE TO REDUCE WAFER PLANAR NONUNIFORMITY

BACKGROUND

Field

Embodiments described herein generally relate to a processing chamber suitable for semiconductor processing and methods of assembling the processing chamber. More specifically, embodiments described herein relate to a boundary to control radiation loss from a heating element and the installation and adjustment thereof.

Description of the Related Art

Deposition and dry etch processes are used to form layers on, and remove all or a portion of one or more layers from, a substrate. For example, it is known to deposit thin metal and dielectric films on substrates, such as directly on a semiconductor substrate or on film layers already formed thereon, using a sputtering process, also known as physical vapor deposition (PVD). Other methods of forming a thin film on a substrate are chemical vapor deposition (CVD) and plasma enhanced CVD (PECVD). Dry etching is commonly used in semiconductor processing to form features in a substrate, or in one or more thin films on the substrate by a reactive ion etch process.

Many thin film deposition and etch processes used in semiconductor and flat panel display production employ substrate processing chambers that are attached to a mainframe of a cluster tool, referred to as a substrate processing system, wherein one or more substrates are loaded into a dedicated processing chamber (e.g., a vacuum chamber) having dedicated hardware therein to support the substrate during a process performed thereon. Maintaining a uniform process temperature is critical for process requirements, safety, and component life. During the thin film deposition and etch processes, large amounts of heat are generated. The substrate can be affected by the heat generated during processing, which can result in non-uniform temperature throughout the substrate if not adequately controlled. For example, a left side of the substrate may be hotter than a right side. A center of the substrate may be hotter than an edge of the substrate and vice versa. Non-uniform temperatures can result in a non-uniform planar pattern of the substrate, which may include deformation of the substrate and uneven material deposition. Further, the temperatures of the substrate may differ with each processing chamber of the substrate processing system and may result in different amounts and quality of deposition for each processing chamber.

Non-uniform temperatures of the substrate may be caused by several factors. The geometry of the substrate processing chamber may interfere with heat transmission to the substrate or may result in a heat sink to draw heat away from the substrate. For example, heat from a heating element may be drawn to the parts of the processing chamber and not the substrate, resulting in uneven temperatures of the substrate. Processes performed on the substrate may introduce heat into portions of the substrate but not the whole substrate. Maintaining a uniform temperature of the substrate is challenging because there is limited space available inside the substrate processing chamber to implement corrective measures, particularly in existing processing chambers.

Therefore, there is a need for a system and a method of adjusting a planar pattern of the substrate that solves the problems described above.

SUMMARY

Embodiments described herein generally relate to a processing chamber suitable for semiconductor processing and methods of assembling the processing chamber. More specifically, embodiments described herein relate to a boundary to control radiation loss from a heating element and the installation and adjustment thereof In one embodiments, a bottom cover plate for use in a substrate processing system includes a central opening configured to be disposed on a shaft of a pedestal of the substrate processing system and a facing surface configured to face a substrate disposed on the pedestal of the substrate processing system. The facing surface comprises a surface finish having regions of different emissivity.

In another embodiment, a bottom cover plate assembly for use in a substrate processing system includes a bottom cover plate. The bottom cover plate includes a central opening configured to be disposed on a shaft of a pedestal of the substrate processing system and a facing surface configured to face a substrate disposed on the pedestal of the substrate processing system. The facing surface includes a surface finish having regions of different emissivity. The substrate processing system includes an adapter configured to position the bottom cover plate in the substrate processing system. The adapter is configured to be disposed on the shaft of the pedestal.

In another embodiment, a substrate processing system includes a processing chamber for processing a substrate. The processing chamber includes a pedestal having a heating element configured to heat the substrate and a shaft. The processing chamber includes a bottom cover plate having a central opening. The bottom cover plate is disposed on the shaft of the pedestal via the central opening. The bottom cover plate includes a facing surface configured to face the substrate. The facing surface includes a textured pattern.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the present disclosure and are therefore not to be considered limiting of its scope, and may admit to other equally effective embodiments.

FIGS. 5A and 5B depict a top view of another embodiment of a substrate and a schematic view of a heat profile of the substrate, respectively, according to one embodiment.

FIGS. 5C and 5D depict a top view of another embodiment of a BCP and schematic view of an emissivity profile of the BCP, respectively, according to one embodiment.

FIGS. 5E and 5F depict a top view of another embodiment of a substrate and a schematic view of a heat profile of the substrate, respectively, according to one embodiment.

FIGS. 5G and 5H depict a top view of another embodiment of a BCP and schematic view of an emissivity profile of the BCP, respectively, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the present disclosure. However, it will be apparent to one of skill in the art that some embodiments of the present disclosure may be practiced without one or more of these specific details. In other instances, well-known features have not been described in order to avoid obscuring one or more embodiments of the present disclosure.

In view of the above, both a challenge and opportunity exists to improve the uniformity of a planar pattern of a substrate in a substrate processing chamber. Accordingly, a processing chamber is provided with an adjustable heating system to correct non-uniformity in the planar pattern.

Embodiments of the disclosure provided herein generally relate to a bottom cover plate (BCP) that enables control of radiation loss from a heating element inside a chamber for processing a substrate. The heating element is used to heat the substrate before or during processing and may heat the substrate unevenly due to uneven heat losses within the chamber. For example, the uneven heating of the substrate may result in uneven deposition of a material on the substrate, which may result in excess processing to correct the deposition or wasted product from disposing of improperly processed substrates. The BCP may be used to correct the uneven heating of the substrate.

During processing, a heat profile of the substrate may be a pattern or gradient such as a linear or radial pattern. Heat from the heating element may radiate in a direction opposite the direction of the substrate. The BCPs discussed herein provide a thermal emissivity boundary configured to absorb the lost heat from the heating element and radiate the heat back to the substrate to adjust the heat profile of the substrate. The BCPs may have emissivity profiles to radiate heat back to the substrate in an inverse pattern of the heat profile to counteract the heat profile of the substrate and compensate for uneven heating. The emissivity profiles may comprise a textured surface pattern or gradient of varying surface roughness.

Processing System Configuration Examples

Figure 1:
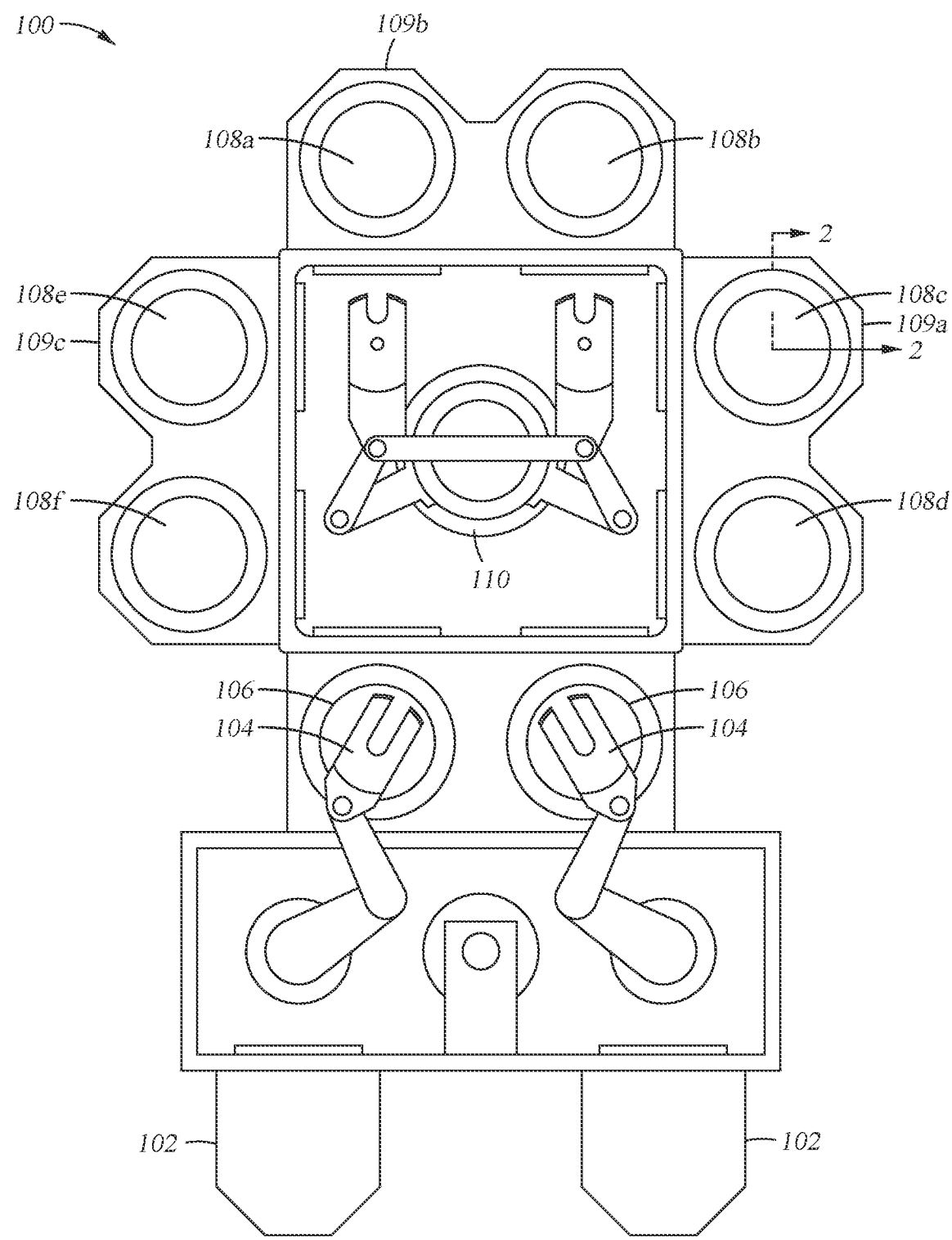
FIG. 1 depicts a top plan view of a processing system that includes deposition, etching, baking, and curing chambers, according to one embodiment.

FIG. 1 depicts a top plan view of a processing system 100 that includes deposition, etching, baking, and curing chambers, according to one embodiment. In the figure, a pair of front opening unified pods (FOUPs) 102 supply substrates of a variety of sizes that are received by robotic arms 104 and placed into a low pressure holding area 106 before being placed into one of substrate processing chambers 108*a-f*, positioned in tandem sections 109*a-c*. A second robotic arm 110 may be used to transport the substrates (e.g., wafers) from the holding area 106 to the substrate processing chambers 108*a-f* and back. Each substrate processing chamber 108*a-f*, can be outfitted to perform a number of substrate processing operations including dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108*a-f* may include one or more system components for depositing, annealing, curing and/or etching a dielectric or metallic film on the substrate. In one configuration, two pairs of the processing chambers, e.g., 108*c-d* and 108*e-f*, may be used to deposit material on the substrate, and the third pair of processing chambers, e.g., 108*a-b*, may be used to etch the deposited material. In another configuration, all three pairs of chambers, e.g., 108*a-f*, may be configured to etch a dielectric or metallic film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by the processing system 100.

Figure 2:
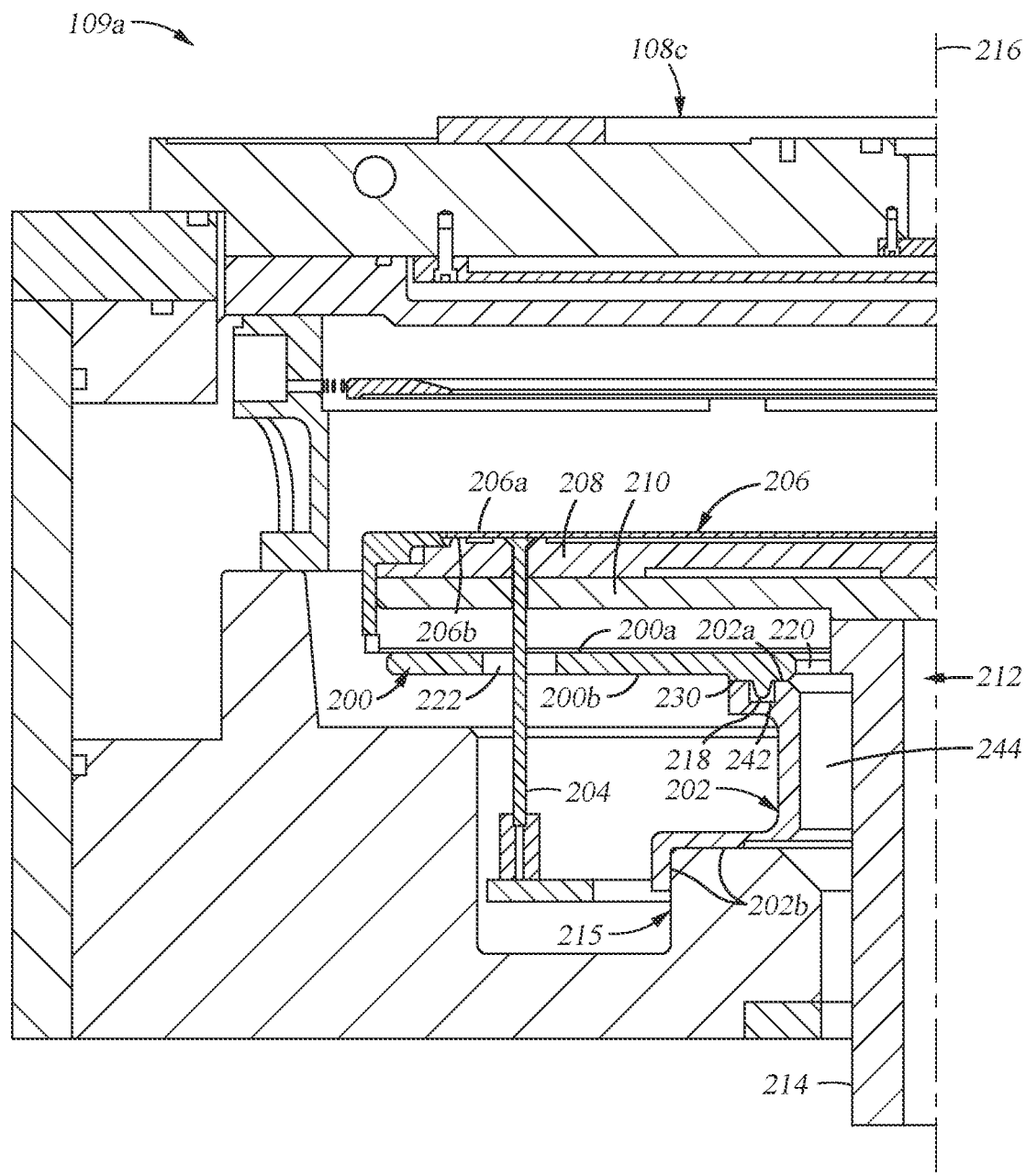
FIG. 2 depicts a cross-sectional view of a bottom cover plate (BCP) installed in a tandem section of a processing system, according to one embodiment.

During the material deposition process, the substrate processing chambers 108*a-f* may heat the substrate unevenly, such as described in relation to FIGS. 2, 4A-B, 4D-E, and 5A-B. The uneven heating may be a result of radiation loss during heating. For example, different components of the tandem sections 109*a-c* and geometries of the processing chambers 108*a-f* may result in an uneven heat transfer between the heating element and the substrate. FIG. 2 discusses an apparatus to adjust a heat profile of the substrate and correct the uneven heating.

Bottom Cover Plate Assembly Examples

FIG. 2 depicts a cross-sectional view of a bottom cover plate (BCP) 200 installed in the tandem section 109*a* of the processing system 100, according to one embodiment. In particular, FIG. 2 shows an inside of the processing chamber 108*c*, which is used for depositing material on a top side 206*a* of a substrate 206. The processing chamber 108*c* comprises a pedestal 212 having a shaft 214 with a shared central axis 216, a heating element 210, and a substrate support 208. A bottom side 206*b* of the substrate 206 rests on the substrate support 208. In the depicted embodiment, the pedestal 212 may move vertically to raise and lower the substrate 206 for processing. The pedestal 212 may further comprise the heating element 210 to heat the substrate 206 prior to and/or during processing.

The processing chamber 108c includes the BCP 200. The BCP 200 has a central opening 220, which is disposed on the shaft 214 of the pedestal 212. The heating element 210 is positioned between the BCP 200 and the substrate 206. A facing surface 200a of the BCP 200 may face the heating element 210 and the substrate 206, absorb heat emitted by the heating element 210, and radiate heat towards the substrate 206. Thus, the BCP 200 acts as a boundary to prevent radiation loss from the heating element 210. For example, the heat from the heating element 210 is radiated off the facing surface 200a of the BCP 200 and directed towards the substrate 206. The facing surface 200a may further comprise a surface finish having regions of different emissivity to absorb and radiate heat in a controlled manner as discussed in relation to FIGS. 3A-C. The radiated heat may be used to adjust a planar pattern of the substrate 206 as discussed in relation to FIGS. 4 and 5.

The BCP 200 further comprises a mounting surface 200b to orient the BCP 200. In the depicted embodiment, the mounting surface 200b is on an opposite side of the BCP 200 than the facing surface 200a. The mounting surface 200b may interface with an adapter 202, which may be used to position the BCP 200. For example, the mounting surface 200b may engage a top side 202a of the adapter 202. The adapter 202 has a central bore 244, which is disposed on the shaft 214 of the pedestal 212. Thus, the BCP 200 and the adapter 202 may be disposed on the shared central axis 216. A bottom side 202b of the adapter 202 may conform to an existing structure 215 of the tandem section 109a. In some embodiments, the bottom side 202b is removably attached to the existing structure 215 of the tandem section 109a. In some embodiments, the bottom side 202b prevents the adapter 202 from rotating.

The BCP 200 comprises an array of keying features 218 (one of which is shown) for fixing the orientation of the BCP 200. The keying features 218 may be disposed on the mounting surface 200b of the BCP 200. In the embodiment shown in FIG. 2, the mounting surface 200b includes a flange 230, which further includes the keying features 218. The top side 202a of the adapter 202 comprises an array of locking features 242 (one of which is shown). The BCP 200 remains stationary when the locking features 242 engage the keying features 218 as discussed in relation to FIGS. 3A-C.

The BCP 200 further comprises an array of pin thru-holes 222 (one of which is shown). In the depicted embodiment, a lift pin 204 travels through the pin thru-hole 222 in the BCP 200 and other parts of the pedestal 212, such as through the substrate support 208 and the heating element 210. The pin thru-holes 222 are aligned with the keying features 218 such that the lift pin 204 passes through the pin thru-hole 222 when the keying features 218 of the BCP 200 engage the locking features 242 of the adapter 202. The lift pin 204 may be one of many lift pins 204 and may lift the substrate 206 off the substrate support 208 when the substrate 206 is transferred to and from the processing chamber 108c.

In some embodiments, the BCP 200 includes the adapter 202. For example, the BCP 200 and the adapter 202 may be one piece such that the rotatable portion of the BCP 200 is rotatably attached to the stationary adapter 202. For example, the adapter 202 and the BCP 200 maybe be separate parts that are affixed together. In another example, the adapter 202 and BCP 200 may be formed into a single part of unitary construction.

In some embodiments, a distance between the BCP 200 and the heating element 210 may be variable. For example, a different adapter 202 may be used to position the BCP 200 closer or further from the heating element 210. In some embodiments, the adapter 202 may comprise an adjustment mechanism to raise or lower the BCP 200 or the adapter 202. For example, the adapter 202 may include adjustable legs to raise and lower the adapter 202 from the processing chamber 108c. The adapter 202 may include adjustable columns to raise and lower the BCP 200.

Although the top side 206a and the bottom side 206b are discussed as being the top and bottom of the substrate 206, other embodiments may be configured differently. For example, the substrate 206 may be arranged in an angled or vertical configuration (in relation to as shown on the page). In some embodiments, the top side 206a of the substrate 206 may be referred to as the first side and the bottom side 206b may be referred to as a second side.

Bottom Cover Plate Configuration Examples

Figure 3A:
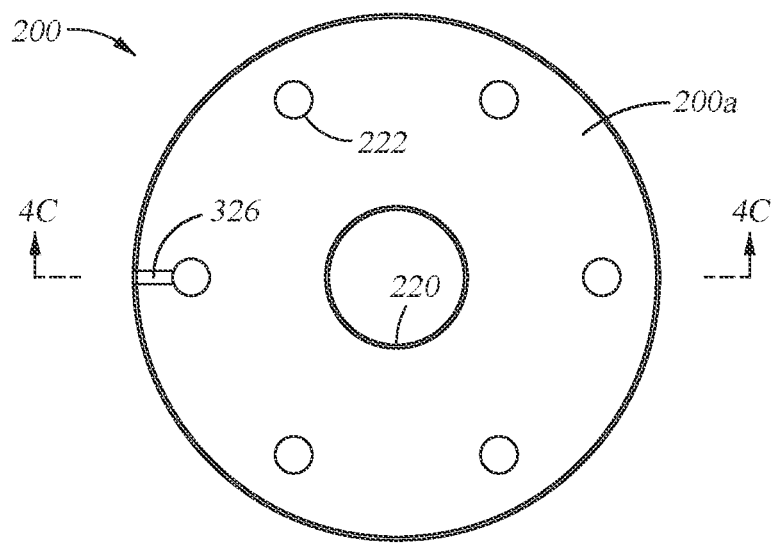
FIGS. 3A and 3B depict top and a bottom views, respectively, of a BCP, according to one embodiment.
Figure 3B:
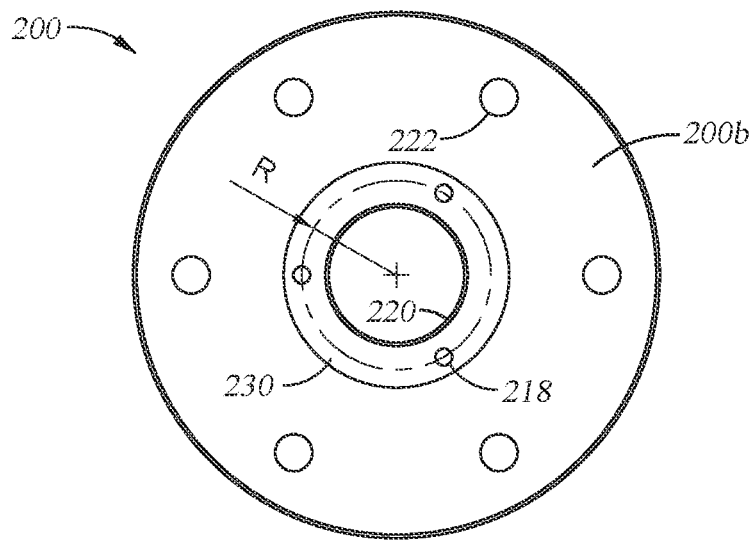

FIGS. 3A and 3B depict top and a bottom views, respectively, of the BCP 200, according to one embodiment. As previously discussed in relation to FIG. 2, the facing surface 200a of the BCP 200 may have a surface finish having regions of different emissivity. A scribe mark 326 may be used to mark an orientation of the regions of different emissivity. For example, the scribe mark 326 may be used to indicate a region of high emissivity. Thus, the scribe mark 326 may be used to position the BCP 200 to absorb heat from the heating element 210 (FIG. 2) and radiate heat in a controlled manner, where regions of higher emissivity radiate more heat than regions of lower emissivity.

Figure 3C:
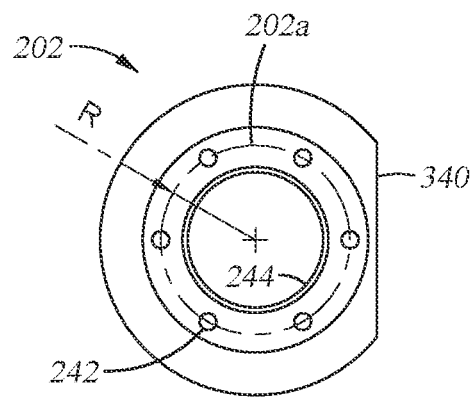
FIG. 3C depicts a top view of an adapter for positioning a BCP, according to one embodiment.

FIG. 3C depicts a top view of the adapter 202 for positioning the BCP 200, according to one embodiment. The adapter 202 includes a clocking feature, shown as a straight portion 340, which may be used to fix the adapter 202 from rotating. For example, a corresponding feature (e.g., a mating straight portion of the existing structure 215, not shown) of the processing chamber 108c (FIG. 2) may engage the straight portion 340 such that adapter remains stationary when the corresponding feature engages the clocking feature. In some embodiments, the clocking feature may conform the adapter 202 to the existing structure 215 of the tandem section 109a as discussed in relation to FIG. 2, where the existing structure 215 is the corresponding feature.

FIGS. 3A-C show the BCP 200 having three keying features 218 and the adapter 202 having six locking features 242, but other embodiments may have more or less. The keying features 218 of the BCP 200 are aligned to the locking features 242 of the adapter 202 such that the BCP 200 may be rotated about the shaft 214 (FIG. 2) to position the BCP 200 in different orientations. For example, the keying features 218, which may be protrusions, are spaced equally apart (e.g., each at a first angle apart) and on a radius (R) from the central axis 216 (FIG. 2). The locking features 242, which may be recesses, are also spaced equally apart (e.g., each at a second angle apart) and on a radius (R) from the central axis 216 of the same magnitude as the keying features 218. In the depicted embodiment, the first angle may be twice the magnitude of the second angle because there are twice as many locking features 242 as there are keying features 218. The different orientations of the BCP 200 correspond to the locking features 242. For example, since there are six locking features 242, there are six potential orientations for the BCP 200. Each locking feature 242 corresponds to an orientation of the BCP 200. Each orientation corresponds to a different configuration of the regions of different emissivity. Thus, the BCP 200 may be rotated about the shaft 214 to adjust the configuration of the regions of different emissivity and the scribe mark 326 may be used to align the regions of different emissivity to the substrate 206 (FIG. 2). At each orientation, the three keying features 218 engage three of the locking features 242.

The array of pin thru-holes 222 (one of which is labeled) allow the lift pins 204 (FIG. 2) to pass through the BCP 200 at discrete locations. In the depicted embodiment, there are six pin thru-holes 222, and the pin thru-hole 222 that is labeled is the same pin thru-hole in FIGS. 3A and 3B. The pin thru-holes 222 are aligned with the keying features 218 such that the lift pin 204 may pass through the through hole when the BCP 200 is aligned. Thus, the BCP 200 can be positioned at six different orientations, where each orientation corresponds to a pin thru-hole 222, when installed in the processing chamber 108c (FIG. 2). In some embodiments, more or less pin thru-holes 222 may be used.

In some embodiments, the number of locking features 242 of the adapter 202 may be the same or more than the number of keying features 218 of the BCP 200. In some embodiments, the BCP 200 may include the locking features 242 and the adapter 202 may include the keying features 218.

In some embodiments, the scribe mark 326 may comprise a complex shape (e.g., a scribe mark 526 in FIG. 5C) or letters to denote the direction of the regions of different emissivity of the BCP 200. In some embodiments, the scribe mark 326 may be located at another location on the BCP 200 such as on the mounting surface 200b.

Figure 4A:
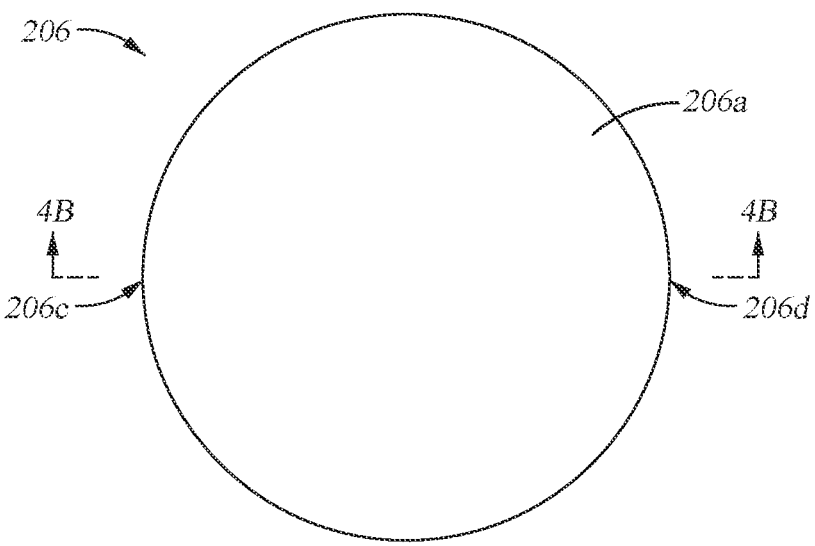
FIGS. 4A and 4B depict a top view of a substrate and a schematic view of a heat profile of the substrate, respectively, according to one embodiment.
Figure 4B:
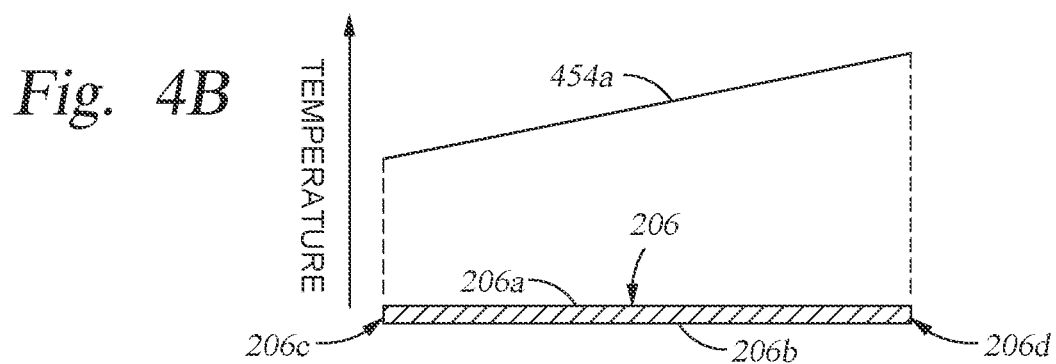

FIGS. 4A and 4B depict a top view of the substrate 206 and a schematic view of a heat profile 454 (shown as a heat profile instance 454a) of the substrate 206, respectively, according to one embodiment. The heat profile 454 may be a mapping of temperatures of the substrate 206 during processing. For example, the heat profile 454 may correspond to temperatures of the top side 206a of the substrate 206. Continuing with this example, the heat profile instance 454a is a mapping of temperatures along the cross-sectional slice shown in FIG. 4B. The heat profile 454 may maintain the same slope across the top side 206a of the substrate 206. For example, the heat profile 454 may maintain the same slope as the heat profile instance 454a across the top side 206a of the substrate 206 (e.g., in to and out of the page as shown in FIG. 4B).

The planar pattern of the substrate 206, which may be a mapping of uniformity of the substrate 206 (e.g., deformation or material deposition thickness), may correspond to the heat profile 454. For example, a higher temperature may correspond to a higher amount of non-uniformity in the planar pattern than a lower temperature. The heat profile 454 may be a temperature profile of the substrate 206. Thus, planar non-uniformity may result from uneven heating of the substrate 206. In the depicted embodiment, the temperature of the substrate 206, as shown in the heat profile instance 454a, increases linearly from a first edge 206c of the substrate 206 to a second edge 206d of the substrate, where the second edge 206d is on an opposite side of the substrate 206 than the first edge 206c.

Figure 4C:
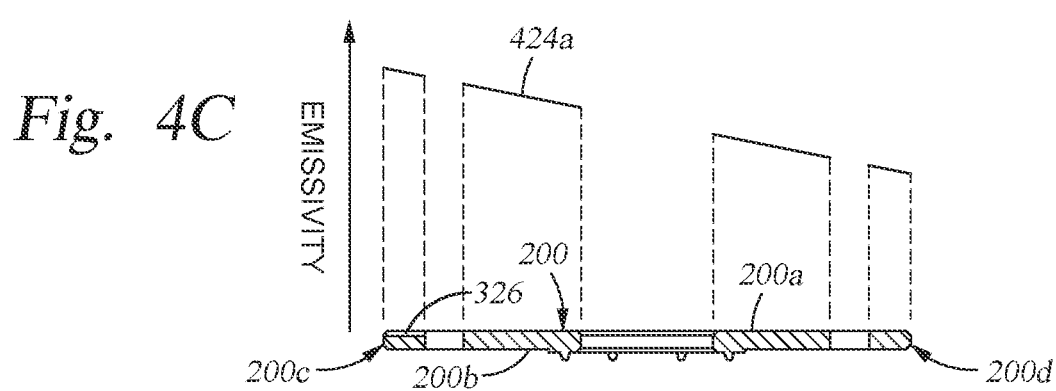
FIG. 4C depicts a schematic view of regions of different emissivity of a BCP, according to one embodiment.

FIG. 4C depicts a schematic view of the regions of different emissivity of the BCP 200, according to one embodiment. In particular, FIG. 4C shows an emissivity profile 424 (shown as an emissivity profile instance 424a) of the BCP 200, which decreases from a first edge 200c of the BCP 200 to a second edge 200d of the BCP 200.

Emissivity is a measure of the efficiency in which a surface emits thermal energy. Emissivity may increase with an increase in surface roughness at a given temperature. For example, when texturizing the facing surface 200a, any portions of the facing surface 200a made smoother generally decreases the emissivity of those portions and any portion of the facing surface 200a made rougher generally increases the emissivity of those portions. As discussed in relation to FIG. 2, the heating element 210 is positioned between the substrate 206 and the BCP 200. Heat from the heating element 210 is normally lost when directed away from the substrate 206. The BCP 200 may absorb the normally-lost heat from the heating element 210 and radiate the absorbed heat back towards the heating element 210 and the substrate 206 to compensate for the thermal non-uniformities on the substrate 206. For example, thermal non-uniformities on the substrate 206 during processing lead to non-uniform deposition on the substrate 206. However, the non-uniform deposition can be corrected if the temperature of the substrate 206 is adjusted to be roughly uniform.

Changing the emissivity of the facing surface 200a of the BCP 200 in a first region, such as a first edge 200c, compared to a second region, such as a second edge 200d, can advantageously counteract thermal non-uniformities that result in non-uniform deposition, such as center-high, middle-high, or edge-high deposition, amongst other non-uniform deposition patterns or other process result patterns for processes other than deposition. Changing the emissivity of the facing surface 200a can also counteract local cool or hot spots on the substrate 206. The regions of different emissivity of the BCP 200 can make the substrate 206 more thermally uniform and therefore the thermally driven process results are more uniform (e.g., material is deposited evenly on the top side 206a). In addition, the emissivity profile 424 of the BCP 200 can also be controlled to be purposely non-uniform, for example, to counter non-uniform processing results driven by factors other than thermal non-uniformity, such as plasma non-uniformity, non-uniformity of process gas distribution over the substrate, or the like.

Thus, the emissivity profile 424 is an inverse profile of the heat profile 454 because the regions of higher emissivity of the BCP 200 radiate more heat to compensate for the lower temperatures of the substrate 206. For example, the emissivity profile instance 424a is a mapping of emissivity along the cross-sectional slice shown in FIG. 4C, and is inverse to the heat profile instance 454a. The emissivity profile 424 may maintain the same slope as shown in the emissivity profile instance 424a across the facing surface 200a (e.g., in to and out of the page as shown in FIG. 4C) of the BCP 200.

The regions of different emissivity of the BCP 200 comprise an emissivity that increases continuously from one end of the BCP 200 to an opposite end of the BCP 200. For example, the emissivity profile 424 of the BCP 200 may increase from the second edge 206d to the first edge 206c, according to a linear gradient. In the depicted embodiment, the emissivity profile 424 is generated by varying a surface roughness of the facing surface 200a. The areas of higher emissivity, such as those at the first edge 200c, may have a higher surface roughness than the areas of lower emissivity, such as those at the second edge 200d. Thus, the surface finish of the BCP 200 may be created by texturizing the facing surface 200a with a textured pattern that is an inverse pattern or profile of the heat profile 454 of the substrate 206, where the lower temperatures of the substrate 206 correspond to a rougher surface of the BCP 200 and the higher temperatures of the substrate correspond to smoother surface of the BCP 200. The inverse pattern of the surface roughness beneficially counteracts the heat profile 454 of the substrate 206 and may heat the substrate 206 evenly during processing.

In some embodiments, texturizing the facing surface 600*a* may comprise modifying the facing surface 200*a* of the BCP 200 to create a surface finish having regions of different emissivity via laser, water jetting, bead blasting, or chemical texturing. In some embodiments, the emissivity profile 424 may be generated using a coating. For example, regions of different emissivity may be formed by coating the facing surface 200*a* of the BCP 200 with a high emissivity coating, where the areas of higher emissivity comprise more high emissivity paint than the areas of lower emissivity. The areas of higher emissivity may comprise a thicker coating or coating more of a surface area than the areas of lower emissivity. The high emissivity coating may be a high-emissivity paint, such as a black paint or other specialty coating known to have a high emissivity.

In some embodiments, the BCP 200 may further comprise a coating to protect the emissivity profile 424 from being damaged. For example, the facing surface 200*a* of the BCP 200 further comprises a protective coating.

In some embodiments, the emissivity profile 424 may compensate for the geometry of the BCP 200. For example, areas surrounding thinner material or negative features (e.g., the pin thru-holes 222 and the central opening 220) may have a higher emissivity to compensate for the thinner material or negative features.

In some embodiments, the planar pattern of the substrate 206 is measured before generating the emissivity profile 424. In some embodiments, measuring the planar pattern of the substrate 206 includes generating the heat profile 454 of the substrate 206.

Figure 4D:
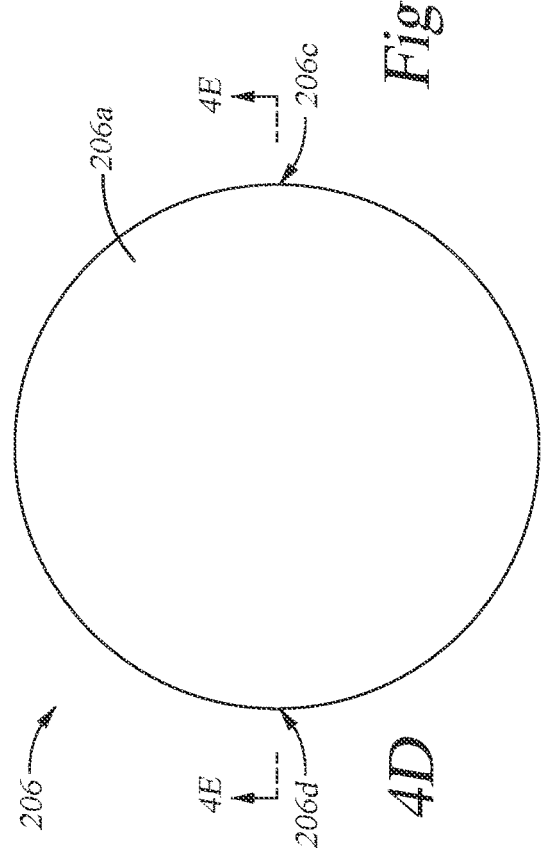
FIGS. 4D and 4E depict a top view of a substrate and a schematic view of a heat profile of the substrate, respectively, according to one embodiment.
Figure 4E:
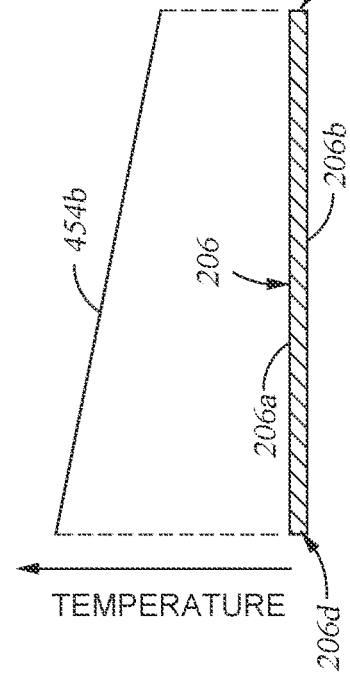

FIGS. 4D and 4E depict a top view of the substrate 206 and a schematic view of the heat profile 454 (shown as a heat profile instance 454*b*) of the substrate 206, respectively, according to one embodiment. The substrate 206 is depicted as rotated 180 degrees in relation to the depiction in FIG. 4A, and so the heat profile instance 454*b* may be a mirrored profile of the heat profile instance 454*a*.

Figure 4F:
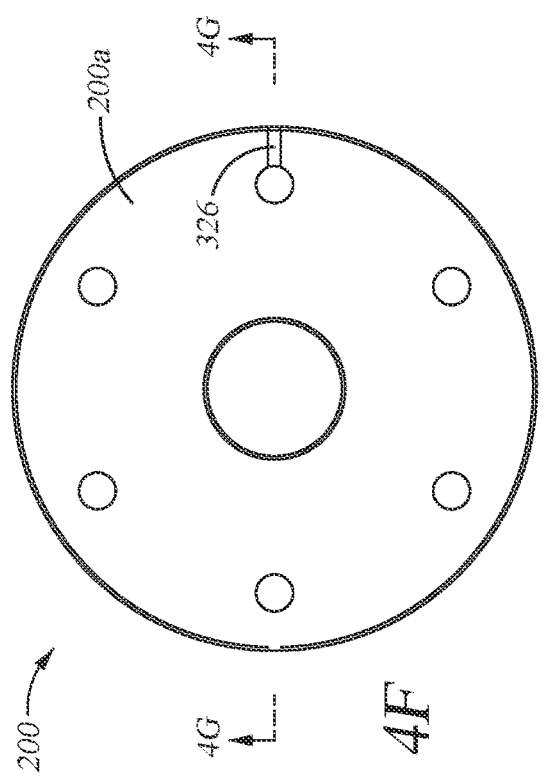
FIGS. 4F and 4G depict a top view of a BCP and schematic view of an emissivity profile of the BCP, respectively, according to one embodiment.
Figure 4G:
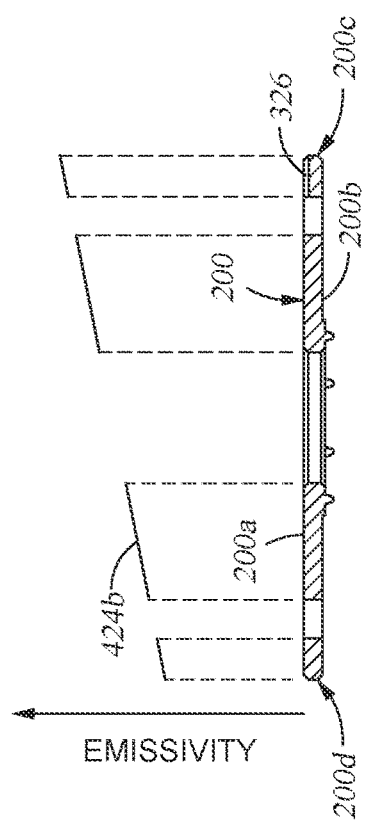

FIGS. 4F and 4G depict a top view of the BCP 200 and a schematic view of the emissivity profile 424 (shown as an emissivity profile instance 424*b*) of the BCP 200, respectively, according to one embodiment. In order to counteract the heat profile 454 shown in FIG. 4E, the BCP 200 is rotated from the orientation shown in FIG. 3A to orient the emissivity profile 424 of the facing surface 200*a*, and this the textured pattern, such that the emissivity profile 424 is an inverse profile of the heat profile 454. For example, the BCP 200 is rotated about the shaft 214, as described in FIG. 3A-C, to orient the BCP 200 such that the emissivity profile instance 424*b* is inverse to the heat profile instance 454*b* and the keying features 218 of the BCP 200 engage the locking features 242 of the adapter 202. The scribe mark 326 may be used to orient the textured pattern of the BCP 200.

In some embodiments, the heat profile of each substrate is mapped. In some embodiments, the textured pattern of the BCP has an emissivity profile mapped to a reference substrate. The reference substrate may be representative of substrates processed in the processing chamber 108*c* (FIG. 2). Mapping the textured pattern to a reference substrate beneficially prevents the need to map the heat profile of each substrate that is processed by the processing chamber 108*c*.

FIGS. 5A and 5B depict a top view of a substrate 506 and a schematic view of a heat profile 554 of the substrate 506, respectively, according to one embodiment. FIGS. 5C and 5D depict a top view of a BCP 500 and schematic view of an emissivity profile 524 of the BCP 500, respectively, according to one embodiment. The substrate 506 and the BCP 500 are dimensionally and structurally similar to the substrate 206 and the BCP 200, and differ as discussed.

The substrate 506 includes a top side 506*a*, a bottom side 506*b*, a first edge 506*c*, and a second edge 506*d*. The heat profile 554 of the substrate 506 may be a mapping of temperatures of the substrate 506 and may be symmetrical about a substrate axis 558. For example, a temperature at locations on a same radius from the substrate axis 558, such as the first edge 506*c* and the second edge 506*d*, may be roughly the same temperature. In the depicted embodiment, the heat profile 554 decreases radially from a center of the substrate 506 (e.g., at the substrate axis 558) to an edge of the substrate 506 (e.g., the first edge 506*c* and the second edge 506*d*), according to a radial gradient.

The BCP 500 includes a facing surface 500*a*, a mounting surface 500*b*, a first edge 500*c*, and a second edge 500*d*. The emissivity profile 524 of the BCP 500 may correspond to a textured pattern of surface roughness and may be symmetrical about a BCP axis 528. The emissivity profile 524 of the BCP 500 may further be an inverse profile of the heat profile 554 of the substrate 506. In the depicted embodiment, the emissivity profile 524 is generated by varying a surface roughness of the surface 500*a*. The regions of different emissivity of the BCP 500 comprise an emissivity that increases continuously from one end of the BCP 500 to an opposite end of the BCP 500. For example, the emissivity profile 524 of the BCP 500 may increase from a center of the BCP 500 (e.g., at the BCP axis 528) to an edge of the BCP 500 (e.g., the first edge 500*c* and the second edge 500*d*), according to a radial gradient.

Consequently, the emissivity profile 524 of the BCP 500, as shown in the perspective of FIG. 5D, remains the same as the BCP 500 is rotated about the BCP axis 528, which may be collinear with the shared central axis 216 discussed in relation to FIG. 2. Thus, aligning the BCP 500 does not require rotating the BCP 500 to orient the emissivity profile 524 according to the heat profile 554 of the substrate 506 when installed in a processing chamber such as the processing chamber 108*c* discussed in relation to FIG. 2. A scribe mark 526 may be used to indicate a directionality of the radial gradient of the emissivity profile 524 (e.g., increasing from the center of the BCP 500 to the edge of the BCP 500). For example, the scribe mark 526 may be an arrow pointing in a direction of increasing emissivity (e.g., towards the edge of the BCP 500).

FIGS. 5E-5H depict a substrate 556 with a heat profile 555 and a BCP 550 with an emissivity profile 525, according to one embodiment. The substrate 556 and the BCP 550 are similar to the substrate 506 and the BCP 500, except for the heat profile 555 and the emissivity profile 525.

The substrate 556 includes a top side 556*a*, a bottom side 556*b*, a first edge 556*c*, a second edge 556*d*, and a substrate axis 559. The heat profile 555 of the substrate 556 may be an inverse profile of the heat profile 554 shown in FIG. 5B. In the depicted embodiment, the heat profile 555 decreases radially from a center of the substrate 556 (e.g., at the substrate axis 559) to an edge of the substrate 556 (e.g., the first edge 556*c* and the second edge 556*d*), according to a radial gradient.

The BCP 550 includes a facing surface 550*a*, a mounting surface 550*b*, a first edge 550*c*, a second edge 550*d*, and a BCP axis 529. The emissivity profile 525 of the BCP 550 may be an inverse profile of the heat profile 555. For example, the emissivity profile 525 of the BCP 550 may decrease from a center of the BCP 550 (e.g., at the BCP axis 529) to an edge of the BCP 550 (e.g., the first edge 550c and the second edge 550d), according to a radial gradient. Thus, aligning the BCP 550 does not require rotating to the BCP 550 to orient the emissivity profile 525 according to the heat profile 555 of the substrate 556. A scribe mark 527 may be used to indicate a directionality of the radial gradient of the emissivity profile 525 (e.g., increasing from the edge of the BCP 550 to the center of the BCP 550). For example, the scribe mark 527 may be an arrow pointing in a direction of increasing emissivity (e.g., towards the center of the BCP 550).

Although linear and radial gradients are discussed, the heat profile of the substrate and the emissivity profile of the BCP may vary. In some embodiments, the gradient profiles may be curved. For example, the gradient path may be exponential or logarithmic. In some embodiments, the gradients may be rectangular or follow a path such as an equation. In some embodiments, the emissivity profile may be discrete instead of continuous to form hot or cold zones in the substrate as described in FIGS. 5I-5J, or to correct for hot or cold zones in the heat profile of the substrate. For example, the emissivity profile may have discrete emissivity regions instead of a continuously varying emissivity. In some embodiments, the heat profile may not be a gradient and may vary in a non-uniform manner. In such embodiments, the emissivity profile may be an inverse profile of the heat profile.

Figure 5I:
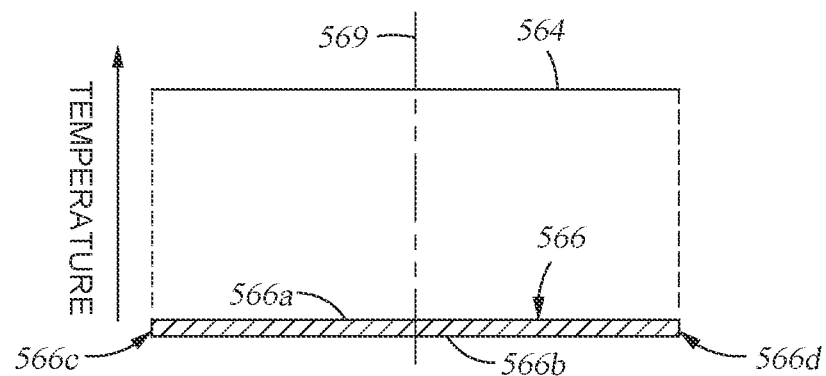
FIGS. 5I and 5J depict schematic views of another embodiment of a heat profile of a substrate and an emissivity profile of a BCP, respectively, according to one embodiment.
Figure 5J:
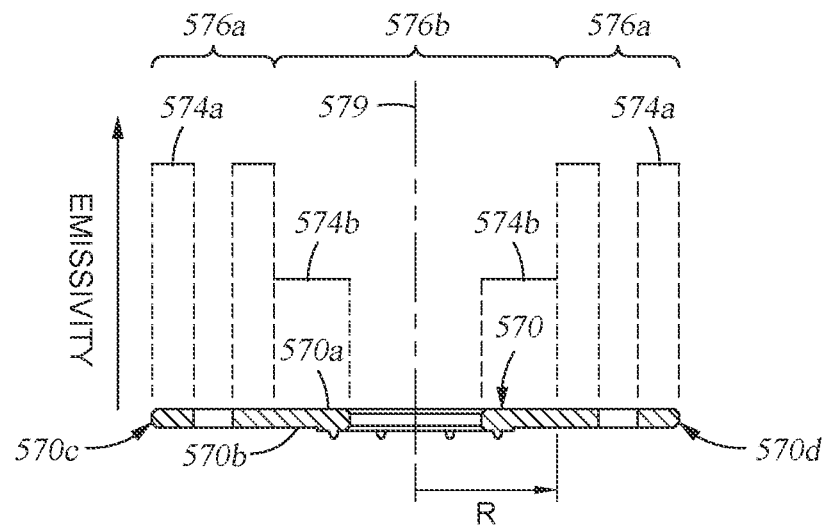

FIGS. 5I and 5J depict schematic views of a heat profile 564 of a substrate 566 and an emissivity profile 574 of a BCP 570, respectively, according to one embodiment. In particular, FIG. 5I shows the substrate 566, which includes a top side 566a, a bottom side 566b, a first edge 566c, a second edge 566d, and a substrate axis 569 at a center of the substrate 566. The heat profile 564 of the substrate is shown as a constant temperature across the substrate 566 to facilitate discussion, but in some embodiments, such as embodiments discussed above, the heat profile 564 may not be constant.

FIG. 5J shows the BCP 570, which includes a facing surface 570a, a mounting surface 570b, a first edge 570c, a second edge 570d, and a BCP axis 579 at a center of the BCP 570. The facing surface 570a includes an emissivity profile 574, which may be used to form hot or cold temperature regions or zones in the substrate 566. The emissivity profile 574 may include a first region 576a of a first emissivity (e.g., a high emissivity region 574a) and a second region 576b of a second emissivity (e.g., a low emissivity region 574b). In the depicted embodiment, the first region 576a of the first emissivity is from the center (e.g., at the BCP axis 579) of the BCP 570 to a radius (R) from the center and the second region of the second emissivity is from the radius R to an edge (e,g, the first or second edge 566c and 566d) of the bottom cover plate. Thus, the first and second regions 576a and 576b, respectively, sweep about the BCP axis 579 such that the emissivity profile 574 forms a target-like pattern of discrete emissivities (e.g., the high and low emissivity regions 574a and 574b) when viewed from above (not shown).

Figure 5K:
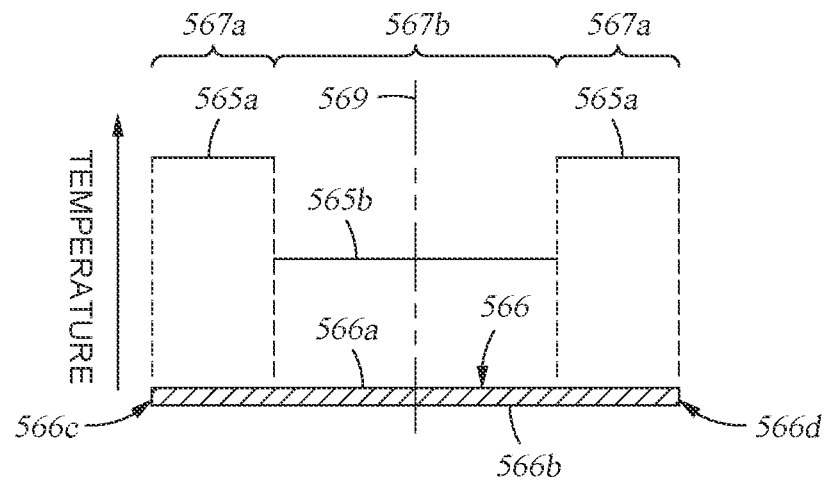
FIG. 5K depicts a schematic view of an adjusted heat profile of the substrate from FIG. 5I, according to one embodiment.

FIG. 5K depicts a schematic view of an adjusted heat profile 565 of the substrate 566, according to one embodiment. Radiation from the emissivity profile 574 of the BCP 570 on the heat profile 564 of the substrate 566 may form the adjusted heat profile 565.

The adjusted heat profile 565 includes a first region 567a of a first temperature (e.g., a high temperature region 565a) and a second region 567b of a second temperature (e.g., a low temperature region 565b). The emissivity profile 574 corresponds to the adjusted heat profile 565 such that the high emissivity region 574a creates the high temperature region 565a and the low emissivity region 574b creates the low temperature region 565b. For example, the emissivity profile 574 may form a hot edge (e.g., the first or second edge 566c and 566d) and cold center (e.g., at the substrate axis 569) of the substrate 566. Thus, the discrete emissivity profile 574 may result in a substrate (e.g., the substrate 566) with regions of discrete temperatures.

In some embodiments, the emissivity profile 574 of the BCP 570 may be inversed such that the BCP 570 may result in a substrate 566 with a cold edge and hot center. In some embodiments, the emissivity profile 574 may include regions of discrete emissivities that are not disposed about the BCP axis 579 in a target-like pattern. For example, the regions of discrete emissivities may include regions with different boundaries across the facing surface 570a of the BCP 570. The regions of discrete emissivities may form regions of different temperatures in the substrate 566, or be used to correct for hot or cold regions or zones in a heat profile of a substrate.

Additional Bottom Cover Plate Assembly Examples

Figure 6:
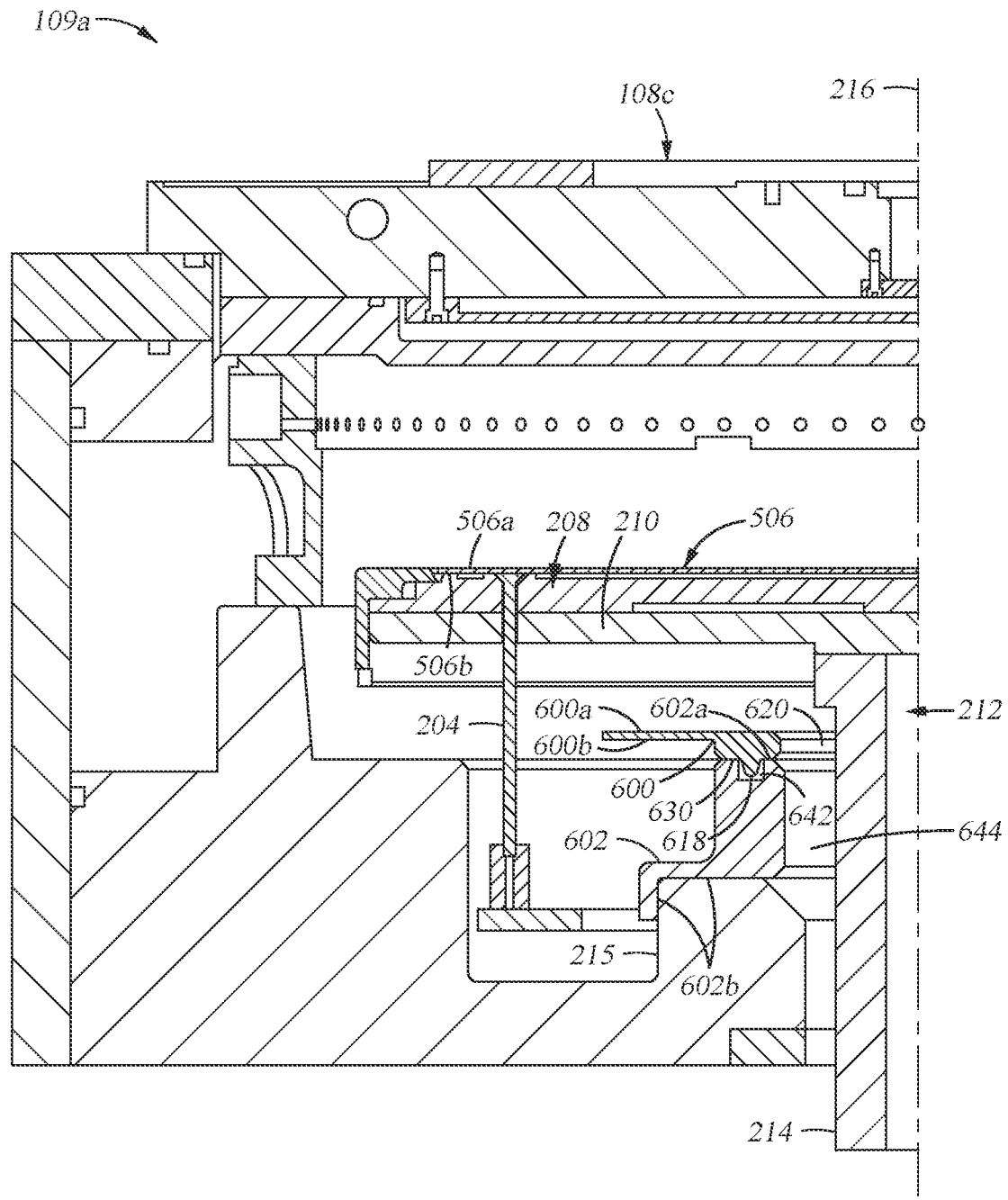
FIG. 6 depicts a cross-sectional view of a BCP installed in a tandem section of a processing system, according to one embodiment.

FIG. 6 depicts a cross-sectional view of a different BCP 600 installed in the tandem section 109a of the processing system 100, according to one embodiment. The BCP 600 is similar to the BCP 500, except as noted. For example, the BCP 600 is smaller such that the BCP 600 does not encroach on the lift pin 204. Thus, the BCP 600 does not require the pin thru-holes 222 discussed in relation to FIGS. 2 and 3. The BCP 600 has a central opening 620 disposed on the shaft 214 of the pedestal 212. A facing surface 600a of the BCP 600 may absorb heat emitted by the heating element 210 and radiate the absorbed heat towards the substrate 506. The facing surface 200a may comprise a surface finish having regions of different emissivity to radiate the absorbed heat in a controlled manner as previously discussed in relation to FIGS. 3-5 and as discussed in relation to FIG. 7.

The facing surface 600a of the BCP 600 comprises an emissivity profile (not shown) similar to the emissivity profile 524 discussed in relation to FIG. 5D. The BCP 600, and thus the facing surface 600a, do not project onto as large an area of the substrate 506 as the BCP 500 discussed in relation to FIG. 5C or the BCP 200 shown in FIG. 2. Thus, the emissivity profile of the BCP 600 may counteract only a portion of the heat profile 554 (FIG. 5B) of the substrate 506. In some embodiments, the emissivity profile may comprise a steeper gradient than the emissivity profile 524 to compensate for the smaller facing surface 600a by radiating more heat from outmost edges of the BCP 600.

A mounting surface 600b of the BCP 600 may engage a top side 602a of an adapter 602. The adapter 602 has a central bore 644 disposed on the shaft 214 of the pedestal 212 and may be used to position the BCP 600. The BCP 600 further comprises a keying feature 618 that engages a locking feature 642 of the adapter 602. The keying feature 618 may be disposed on the mounting surface 600b of the BCP 600. For example, the keying feature 618 may be disposed on a flange 630 of the mounting surface 600b. The locking feature 642 may be disposed on a top side 602a of the adapter 602. A bottom side 602b of the adapter may conform to the existing structure 215 of the tandem section 109a.

In the depicted embodiment, the keying feature 618 may be a ridge formed around the central opening 620. The locking feature 642 may be a groove or channel formed in the top side 602a around the central bore 644. In some embodiments, the keying feature 618 of the BCP 600 may comprise the keying features 218 discussed in relation to FIGS. 2 and 3. The locking feature 242 of the adapter 602 may comprise the locking features 242 discussed in relation to FIGS. 2 and 3.

In some embodiments, the BCP 600 includes the adapter 602. For example, the BCP 600 and the adapter 602 may be one piece such that the rotatable portion of the BCP 600 is rotatably attached to the stationary adapter 602. The BCP 600 may alternatively be fixed to the adapter 602 such that the BCP 600 and the adapter 602 may only rotate as one body.

Figure 7:
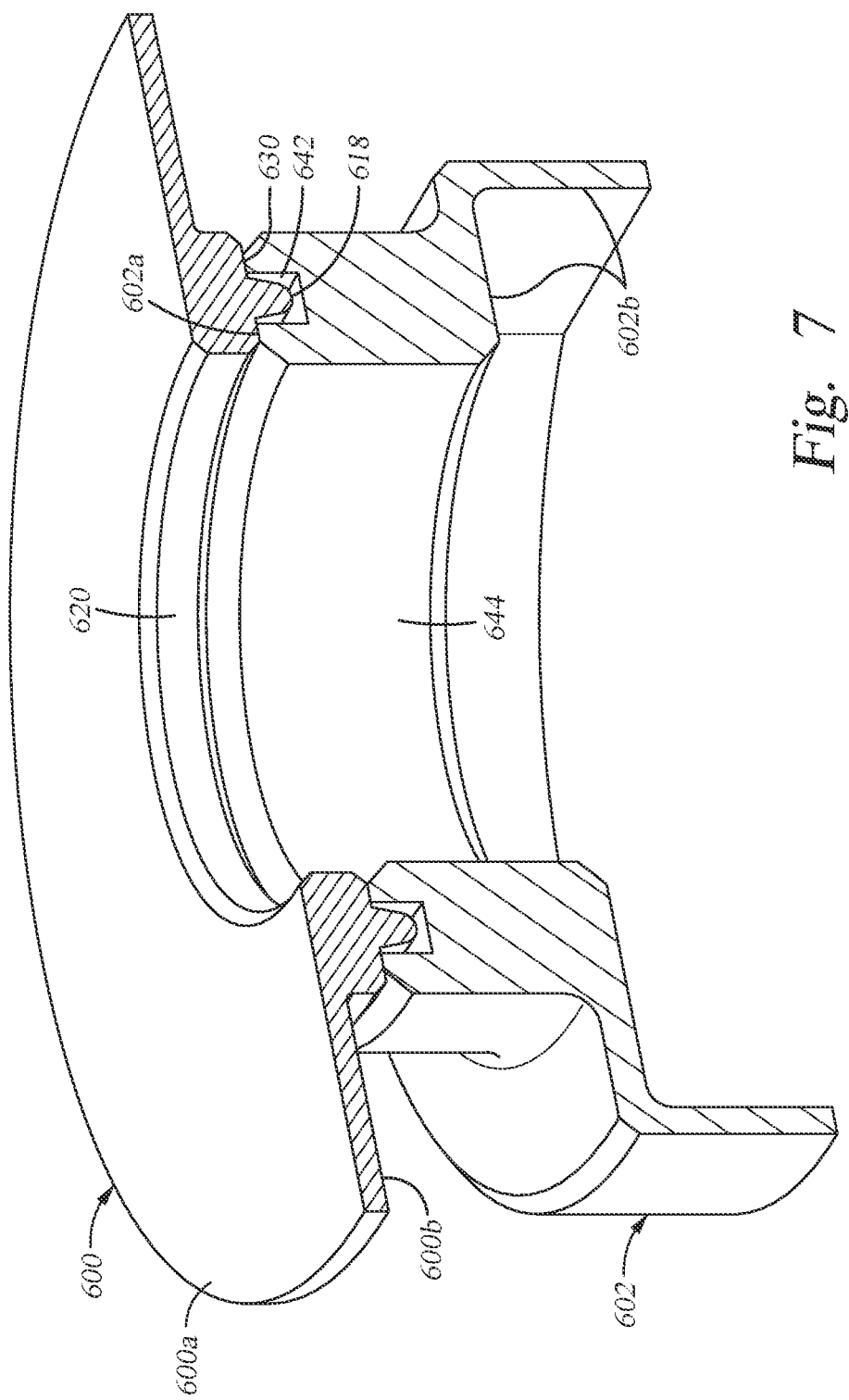
FIG. 7 depicts an isometric, cross sectional view of a BCP and an adapter, according to one embodiment.

FIG. 7 depicts an isometric, cross sectional view of the BCP 600 and the adapter 602, according to one embodiment. In particular, FIG. 7 provides a different perspective of elements and features discussed in FIG. 6.

Figure 8:
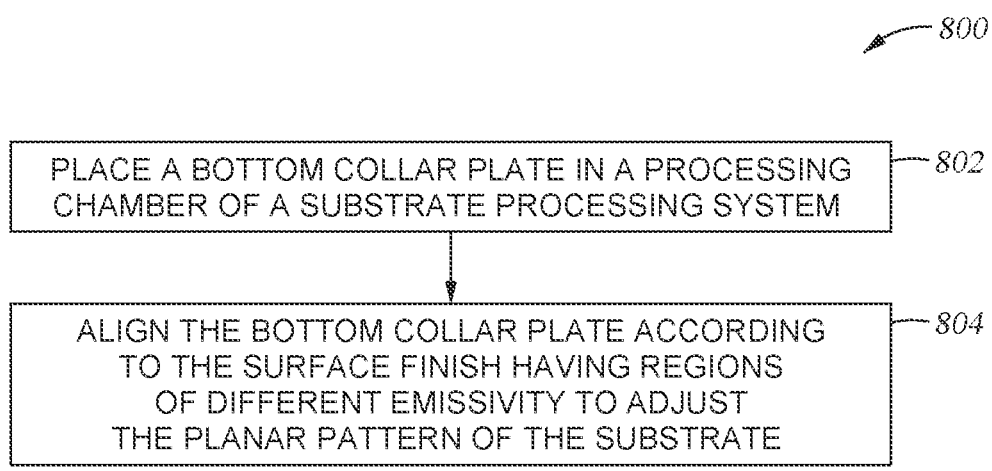
FIG. 8 depicts a flowchart of a method for adjusting a planar pattern of a substrate, according to one embodiment.

FIG. 8 depicts a flowchart of a method 800 for adjusting a planar pattern of a substrate, according to one embodiment. The method 800 begins at block 802 with placing a bottom cover plate in a processing chamber of a substrate processing system as discussed in relation to FIGS. 2 and 6.

The method continues at block 804 with aligning the bottom cover plate according to the surface finish having regions of different emissivity to adjust the planar pattern of the substrate as discussed in relation to FIGS. 2-6.

In some embodiments of method 800, the bottom cover plate comprises a surface finish having regions of different emissivity as discussed in relation to FIGS. 2-6. In some embodiments of method 800, the surface finish having regions of different emissivity faces the substrate as discussed in relation to FIGS. 2 and 6.

In some embodiments, the bottom cover plate is disposed on a central axis of a pedestal of the processing chamber as discussed in relation to FIGS. 2, 3A-C, and 6.

In some embodiments, the surface finish having regions of different emissivity is a textured pattern as discussed in relation to FIGS. 2-6.

In some embodiments, the planar pattern of the substrate corresponds to a heat profile of the substrate as discussed in relation to FIGS. 2 and 4A-B.

In some embodiments, aligning the bottom cover plate comprises rotating the bottom cover plate about the central axis to orient the textured pattern of the bottom cover plate in an orientation where the textured pattern is inverse to the heat profile of the substrate as discussed in relation to FIGS. 2-4.

Some embodiments further include heating the substrate using a heating element positioned between the bottom cover plate and the substrate as discussed in relation to FIGS. 2 and 6.

In some embodiments, the processing chamber further comprises an adapter as discussed in relation to FIGS. 2, 6, and 7. In some embodiments, the bottom cover plate engages the adapter when placed in the processing chamber. In some embodiments, the adapter is disposed on the central axis of the pedestal, engages a feature of the processing chamber, provides an interface to orient the bottom cover plate, and remains stationary when the bottom cover plate is rotated about the central axis.

Note that FIG. 8 is just one example of a method, and other methods including fewer, additional, or alternative blocks are possible consistent with this disclosure.

Embodiments of the present disclosure have been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A bottom cover plate for use in a substrate processing system, comprising:
   a central opening configured to be disposed around a shaft of a pedestal of the substrate processing system, the bottom cover plate configured to cover a least a portion of a chamber bottom of the substrate processing system;
   a facing surface configured to face a substrate disposed on the pedestal of the substrate processing system, wherein the facing surface comprises a surface finish having regions of different emissivity; and
   a mounting surface, on an opposite side of the bottom cover plate than the facing surface, comprising a flange, the flange comprising an array of keying features protruding from the mounting surface and configured to engage with a recess in a top side of an adapter disposed around the shaft of the pedestal, the adapter is connected to the bottom of the chamber.

2. The bottom cover plate of claim 1, wherein the surface finish of the bottom cover plate is a textured pattern.

3. The bottom cover plate of claim 2, wherein the textured pattern of the bottom cover plate is an inverse pattern of a heat profile of the substrate.

4. The bottom cover plate of claim 3, wherein the bottom cover plate is configured to rotate about the shaft of the pedestal to orient the textured pattern of the bottom cover plate in an orientation.

5. The bottom cover plate of claim 4, wherein the adapter is configured to position the bottom cover plate in the substrate processing system.

6. The bottom cover plate of claim 5, wherein the array of keying features are configured to engage an array of locking features of the adapter such that bottom cover plate remains stationary when the locking feature engages the array of keying features.

7. The bottom cover plate of claim 6, wherein the bottom cover plate has a thru-hole aligned with the array of keying features such that the thru-hole is configured to have a lift pin of the substrate processing system pass through the thru-hole when the array of keying features of the bottom cover plate engages the array of locking features of the adapter.

8. The bottom cover plate of claim 1, wherein the regions of different emissivity of the bottom cover plate comprise an emissivity that increases continuously from one end of the bottom cover plate to an opposite end of the bottom cover plate.

9. The bottom cover plate of claim 8, wherein the one end of the bottom cover plate and the opposite end of the bottom cover plate comprise a center of the bottom cover plate and an edge of the bottom cover plate.

10. The bottom cover plate of claim 8, wherein:
    the one end of the bottom cover plate is a first edge of the bottom cover plate and the opposite end of the bottom cover plate is a second edge of the bottom cover plate; and
    the second edge is on an opposite side of the bottom cover plate than the first edge.

11. The bottom cover plate of claim 8, wherein the emissivity of the bottom cover plate increases according to a linear gradient or a radial gradient.

12. The bottom cover plate of claim 1, wherein the regions of different emissivity of the bottom cover plate comprise a first region of a first emissivity and a second region of a second emissivity.

13. The bottom cover plate of claim 12, wherein the first region of the first emissivity is from a center of the bottom cover plate to a radius from the center and the second region of the second emissivity is from the radius from the center to an edge of the bottom cover plate.

14. The bottom cover plate of claim 1, where the bottom cover plate further comprises a scribe mark, wherein the scribe mark marks an orientation of the regions of different emissivity.

15. The bottom cover plate of claim 1, wherein the facing surface of the bottom cover plate further comprises a protective coating.

16. A bottom cover plate assembly for use in a substrate processing system, comprising:
 a bottom cover plate configured to cover a least a portion of a chamber bottom of the substrate processing system, wherein the bottom cover plate comprises:
  a central opening configured to be disposed around a shaft of a pedestal of the substrate processing system;
  a facing surface configured to face a substrate disposed on the pedestal of the substrate processing system, wherein the facing surface comprises a surface finish having regions of different emissivity; and
  a mounting surface, on an opposite side of the bottom cover plate than the facing surface, comprising a flange, the flange comprising an array of keying features protruding from the mounting surface; and
 an adapter, wherein a top side of the adapter includes recesses configured to engage with the array of keying features to position the bottom cover plate in the substrate processing system, wherein the adapter is configured to be disposed around the shaft of the pedestal, the adapter is connected to the bottom of the chamber.

17. The bottom cover plate assembly of claim 16, wherein the surface finish of the bottom cover plate is a textured pattern.

18. The bottom cover plate assembly of claim 17, wherein the textured pattern of the bottom cover plate is an inverse pattern of a heat profile of the substrate.

19. A substrate processing system, comprising:
 a processing chamber for processing a substrate configured to heat the substrate, wherein the processing chamber comprises:
  a pedestal, wherein the pedestal comprises a shaft; and
  a bottom cover plate configured to cover at least a portion of a chamber bottom of the processing chamber, wherein the bottom cover plate comprises:
   a central opening, wherein the bottom cover plate is disposed around the shaft of the pedestal via the central opening;
   a facing surface configured to face the substrate, wherein the facing surface comprises a textured pattern; and
   a mounting surface, on an opposite side of the bottom cover plate than the facing surface, comprising a flange, the flange comprising an array of keying features protruding from the mounting surface and configured to engage with recesses of a top side of an adapter disposed around the shaft of the pedestal, the adapter is connected to the bottom of the chamber.

20. The substrate processing system of claim 19, wherein:
 the textured pattern is a linear gradient or a radial gradient and is inverse to a heat profile of the substrate; and
 a scribe mark marking an orientation of the linear gradient or the radial gradient.

* * * * *